United States Patent
Chau et al.

(10) Patent No.: US 6,191,016 B1
(45) Date of Patent: Feb. 20, 2001

(54) METHOD OF PATTERNING A LAYER FOR A GATE ELECTRODE OF A MOS TRANSISTOR

(75) Inventors: Robert S. Chau; Thomas Letson, both of Beaverton; Patricia Stokley, Aloha; Peter Charvat; Ralph Schweinfurth, both of Portland, all of OR (US)

(73) Assignee: Intel Corporation, Santa Clara, CA (US)

( * ) Notice: Under 35 U.S.C. 154(b), the term of this patent shall be extended for 0 days.

(21) Appl. No.: 09/226,503

(22) Filed: Jan. 5, 1999

(51) Int. Cl.[7] .................. H01L 21/3205; H01L 21/4763
(52) U.S. Cl. .................. 438/585; 438/952; 438/736; 438/717; 438/740; 438/942; 438/945; 438/947; 438/950
(58) Field of Search .................... 438/736, 717, 438/740, 942, 945, 947, 950, 952

(56) References Cited

U.S. PATENT DOCUMENTS

| | | | |
|---|---|---|---|
| 5,302,538 | * | 4/1994 | Ishikawa et al. . |
| 5,431,770 | * | 7/1995 | Lee et al. . |
| 5,441,914 | * | 8/1995 | Taft et al. . |
| 5,747,388 | * | 5/1998 | Kusters et al. . |
| 5,891,784 | * | 4/1999 | Cheung et al. . |
| 5,963,841 | * | 10/1999 | Karlsson et al. . |
| 5,965,461 | * | 10/1999 | Yang et al. . |

* cited by examiner

*Primary Examiner*—John F. Niebling
*Assistant Examiner*—Jonathan Hack
(74) *Attorney, Agent, or Firm*—Blakely, Sokoloff, Taylor & Zafman LLP

(57) ABSTRACT

A structure is provided comprising a semiconductor substrate, a gate oxide layer on the substrate, and a polysilicon layer on the gate oxide layer. A masking layer is formed on the polysilicon layer. The masking layer is then patterned into a mask utilizing conventional photolithographic techniques, but without patterning the polysilicon layer. The photoresist layer is then removed, whereafter the mask, which is patterned out of the masking layer, is utilized for patterning the polysilicon layer. The use of a carbon free mask for patterning the polysilicon layer, instead of a conventional photoresist layer containing carbon, results in less breakthrough through the gate oxide layer when the polysilicon layer is patterned. Less breakthrough through the gate oxide layer allows for the use of thinner gate oxide layers, and finally fabricated transistors having lower threshold voltages.

8 Claims, 3 Drawing Sheets

METHOD OF PATTERNING A LAYER FOR A GATE ELECTRODE OF A MOS TRANSISTOR

BACKGROUND OF THE INVENTION

1). Field of the Invention

The present invention relates to a method of patterning a layer which is utilized for forming a gate electrode of a metal-oxide-semiconductor (MOS) transistor, a method of forming a transistor, and a transistor which may be manufactured according to the method.

2). Discussion of Related Art

Electronic circuits are often manufactured as integrated circuits in and on semiconductor wafers. An integrated circuit comprises many interconnected electronic components, such as transistors, diodes, capacitors and other devices, which are manufactured in and on the semiconductor wafer. FIG. 1 of the accompanying drawings illustrates two conventional metal-oxide-semiconductor (MOS) transistors 110 which are manufactured in and on a semiconductor substrate 112. Each transistor 110 includes a gate oxide layer 114 and a gate electrode 116, typically of the polysilicon, on the gate oxide layer 114. Spacers 118 are usually formed on opposing sides of the gate electrode 116 The substrate 112 is generally P or N doped silicon. The substrate includes source and drain regions 120 which are of opposite doping to the rest of the substrate 112. The source and drain regions 120 are usually manufactured by ion implantation of dopants respectively after the gate electrode and after the spacers 118 are formed. The source and drain regions 120 are thus spaced from one another by a distance which depends on the width, or gate length 122 of the gate electrode 116 Silicide regions 124 are formed on the source and drain regions 120 by reacting metal with the material of the source and drain regions 120.

In order to increase the speed with which the transistor 110 operates, or "switches", it may be necessary to reduce the distance by which the source and drain regions 120 are spaced from one another, i.e. to reduce the gate length 122. However, dopants oftentimes tend to outdiffuse from the source and drain regions 120. Outdiffusion is undesirable since it could cause leaking of the transistor 110. In order to reduce the gate length 122 and still prevent outdiffusion of dopants from the source and drain regions 120, it may be necessary to increase the concentration of dopants of the substrate 112.

An increase in dopant concentration of the substrate 112 results in a higher threshold voltage (the voltage which is applied to the gate electrode which causes the transistor 110 to switch) of the transistor 110. In order to reduce the threshold voltage of the transistor 110, it may be necessary to reduce the thickness of the gate oxide layer 114. A reduction in the thickness of the gate oxide layer 114 may be difficult to obtain for reasons which are now discussed with reference to FIGS. 2a to 2c.

In addition, a thinner gate oxide will give higher gate capacitance which, in turn, will provide a higher transistor drive current.

FIG. 2a illustrates a substrate 222 with a gate oxide layer 224 and a polysilicon layer 226 formed thereon. A photoresist layer 228 is formed on the polysilicon layer 226. The photoresist layer 228 consists primarily of carbon. The photoresist layer 228 is then patterned as illustrated in FIG. 2b so that portions 230 thereof remain which are dimensioned according to the size of a required gate electrode. With the portions 230 acting as a mask, the polysilicon layer 226 is then etched away as illustrated in FIG. 2c.

Carbon of the polysilicon portions 230 reacts with the material of the gate oxide layer 224, forming carbon monoxide and breakup of or breakthrough through the gate oxide layer 224. Breakthrough through gate oxide layer particularly becomes a problem when gate oxide layers have thicknesses less than 10 Å, and results in a roughened surface on the substrate 222. A roughened surface on the substrate 222 may result in defective silicide regions being formed thereon. Defective silicide regions will cause high parasitic resistance in the eventually fabricated transistor which will degrade transistor drive current performance, or other defects such as leakage of the eventually fabricated transistor.

SUMMARY OF THE INVENTION

In a structure comprising a semiconductor substrate, a gate oxide layer on the substrate, and a first layer on the gate oxide layer, a method is provided of patterning the first layer. A mask is formed over the first layer. The mask is substantially free of carbon and comprises at least two masking portions with an opening between the masking portions. The first layer is then etched through in an area between the masking portions. The first layer is etched at least until the gate oxide layer is exposed with the masking portions at least partially preventing etching of portions of the first layer below the masking portions.

BRIEF DESCRIPTION OF THE DRAWINGS

The invention is further described by way of example with reference to the accompanying drawings wherein.

DETAILED DESCRIPTION OF THE INVENTION

A method of masking a layer on a gate oxide layer, a method of forming a MOS transistor, and a final transistor are described. In the following description, for purposes of explanation, numerous specific details are set forth in order to provide a thorough understanding of the present invention. It will be evident, however, to one skilled in the art, that the present invention may be practiced without these specific details.

A structure is provided comprising a semiconductor substrate, a gate oxide layer on the substrate, and a polysilicon layer on the gate oxide layer. A masking layer comprising little or no carbon is formed on the polysilicon layer. The masking layer is then patterned into a mask utilizing conventional photolithographic techniques, but without patterning the polysilicon layer. The photoresist layer is then removed, whereafter the mask, which is patterned out of the masking layer, is utilized for patterning the polysilicon layer. The use of a carbon free mask for patterning the polysilicon layer, instead of a conventional photoresist layer containing carbon, results in less breakthrough through the gate oxide layer when the polysilicon layer is patterned. Less breakthrough through the gate oxide layer allows for the use of thinner gate oxide layers, and finally fabricated high performance transistors.

Figure 1:
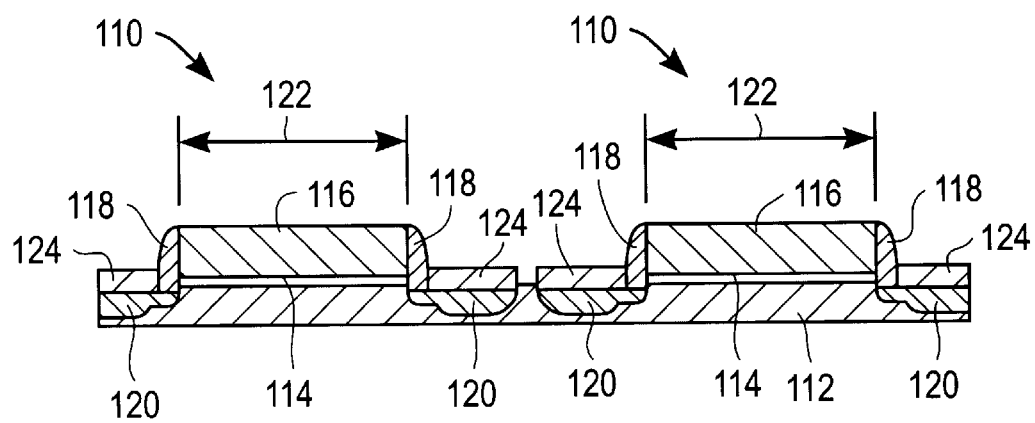
FIG. 1 is a side view which illustrates a substrate in which and on which conventional semiconductor transistors are formed.
Figure 2A:
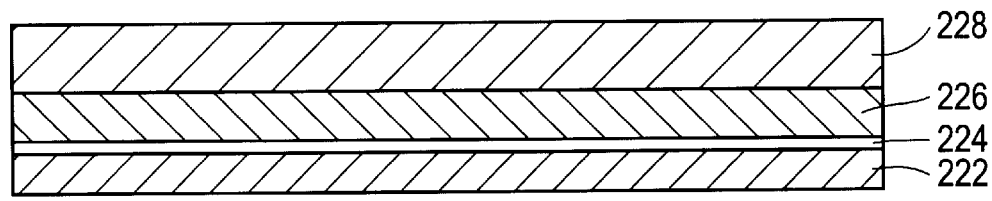
FIG. 2a is side view which illustrates a substrate 1 with a gate oxide layer, a polysilicon layer, and a photoresist layer formed thereon.
Figure 2B:
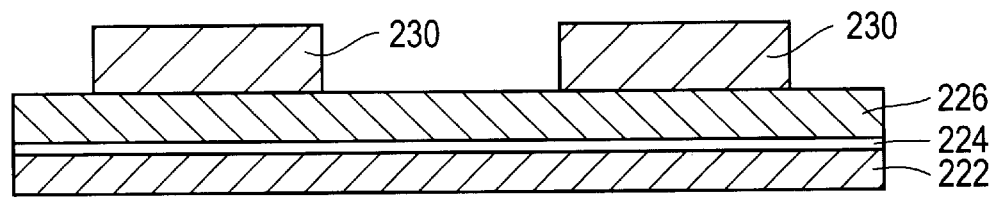
FIG. 2b is a view similar to FIG. 2a after the photoresist layer is patterned.
Figure 2C:
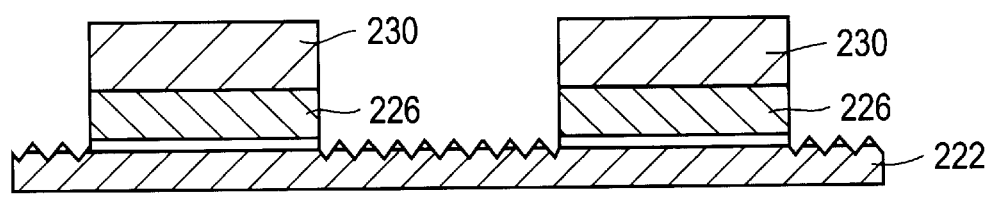
FIG. 2c is a view similar to FIG. 2b after etching through the polysilicon layer with the photoresist layer acting as a mask.
Figure 3A:
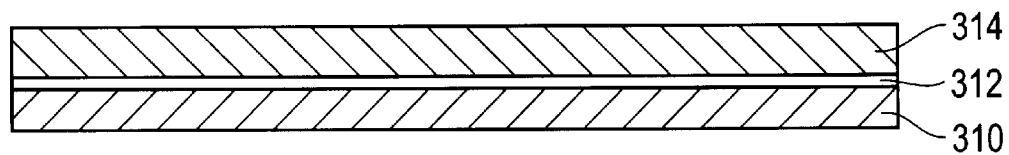
FIG. 3a is a side view which illustrates a semiconductor substrate with a gate oxide layer and a first layer formed thereon.

FIG. 3a of the accompanying drawings illustrates a structure comprising a semiconductor substrate 310, a gate oxide layer 312 which is formed on the semiconductor substrate 310, and a first layer 314 which is formed on the gate oxide layer 312.

The semiconductor substrate 310 may be made of silicon and may have a dopant concentration which is preferably at least $1 \times 10^{18}$ atoms per cubic centimeter and more preferably at least $3 \times 10^{18}$ atoms per cubic centimeter.

The gate oxide layer 312 is preferably less than 10 Å thick, more preferably less than 5 Å thick, and may be as thick as one monolayer. Processes exist in the art for forming oxide layers which are as thick as stated, for example has described in the specification of U. S. patent application No. 08/987,888 which is assigned to the same assignee as the present case.

The first layer 314 may be a semiconductor layer such as polysilicon and may have a thickness of between 1500 Å and 3000 Å, and typically has a thickness of about 2500 Å. As will be seen hereinbelow, the first layer 314 is used to form a gate electrode of a transistor. It is, however, within the scope of the invention that the first layer 314 be made of any other material which is formed into a plug, and that the plug be replaced with a gate electrode for the transistor.

A method of patterning the structure, and in particular the first layer 314, of FIG. 3a is now described.

Figure 3B:
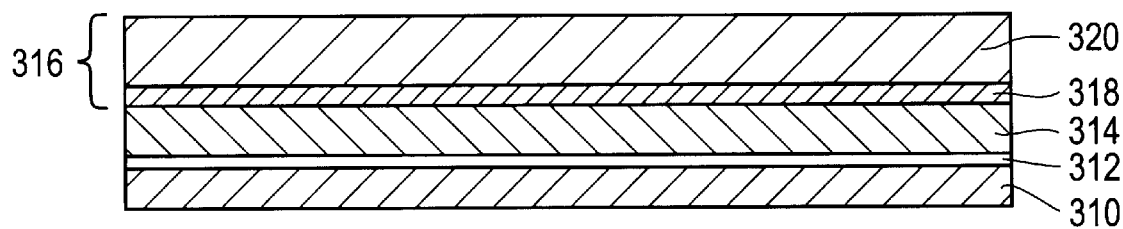
FIG. 3b is a view similar to FIG. 3a after a masking layer, comprising a second layer and a third layer, is formed on the first layer.

First, as illustrated in FIG. 3b, a masking layer 316 is formed on the first layer 314. The masking layer 316 includes a second layer 318 which is formed on the first layer 314, and a third layer 320 which is formed on the second layer 318. The third layer 320 may be made of a material which, when formed directly on the first layer 314, may result in stresses between the first layer 314 and the third layer 320. The second layer 318 may, in use, serve to relieve stresses between the first layer 314 and the third layer 320.

The second layer 318 may be a base silicon oxide layer. An important feature of the second layer 318 may be that it contains very little or no carbon. The second layer 318 may have a thickness of between 50 Å and 200 Å, and typically has a thickness of about 100 Å. The second layer 318 may be deposited in a magnatron vapor deposition chamber of conventional kind wherein a mixture of gases is introduced comprising silene at a rate of 12 standard liters per minute, $N_2O$ at 360 standard liters per minute, and $N_2$ at 2200 standard liters per minute, wherein a pressure within the magnatron sputter deposition chamber is about 4.5 torr, a temperature within the magnatron vapor deposition chamber is about 400° C., and RF power of about 130 watt is applied.

The third layer 320 may be an oxynitride layer. An important feature of the third layer 320 may be that it contains very little or no carbon. The oxynitride layer 320 may have a chemical formula which is $Si_xNi_yO_z$. As an example, x may be 3, y may be 4, and z may be 6. The third layer 320 may have a thickness of between 150 Å and 300 Å. The third layer 320 preferably has a thickness of about 190 Å for a given thickness of the first layer 314 of about 2500 Å. The third layer may be deposited in a magnatron vapor deposition chamber wherein a mixture of gases is introduced comprising silene at a rate of 81 standard liters per minute, $N_2O$ at a rate of 110 standard liters per minute, and $N_2$ that a rate of 1750 standard liters per minute, wherein a pressure within the magnatron sputter deposition chamber is about 4.0 torr, a temperature within the magnatron vapor deposition chamber is about 400° C., and RF power of about 110 watt is applied.

Figure 3C:
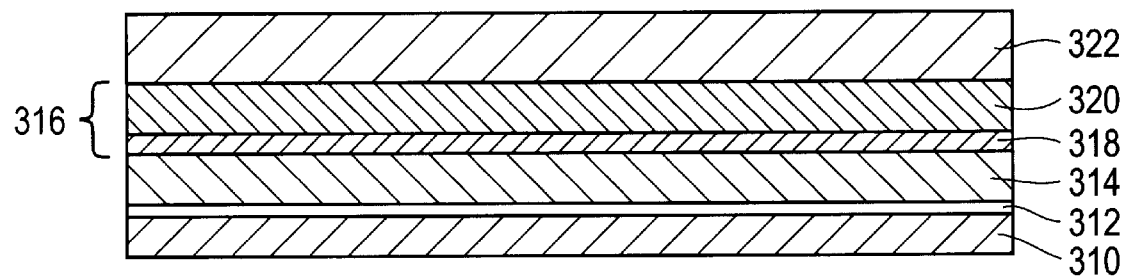
FIG. 3c is a view similar to FIG. 3b after a photoresist layer is formed on the asking layer.
Figure 3D:
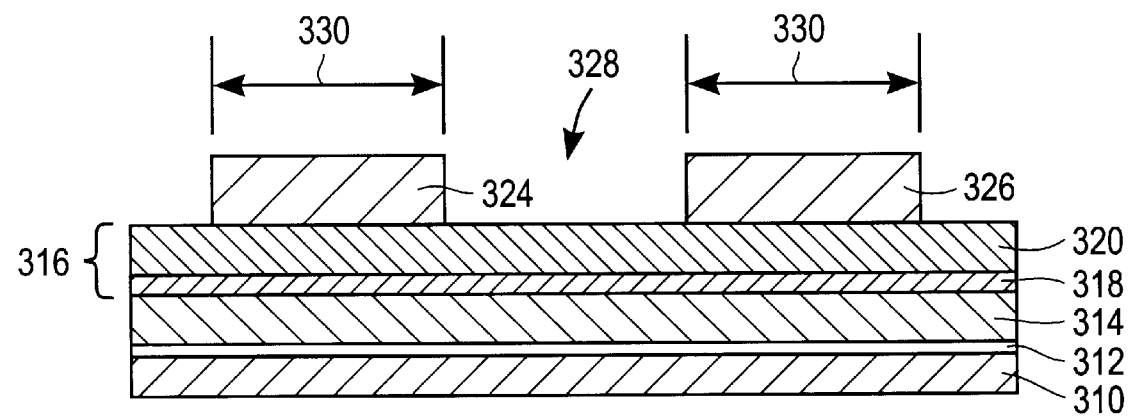
FIG. 3d is a view similar to FIG. 3c after the photoresist layer is patterned.

Next, as illustrated in FIG. 3c, a photoresist layer 322 is deposited on the third layer 320 and, as illustrated in FIG. 3d, the photoresist layer 322 is patterned. Techniques for depositing and patterning of photoresist layers are known in the art. After patterning of the photoresist layer 322, portions 324 and 326 of the photoresist layer (hereinafter referred to as "photoresist portions 324 and 326") remain on the third layer 320 with an opening 328 between the photoresist portions 324 and 326. Each photoresist portion 324 or 326 has a width 330 which, as will be seen hereinbelow, determines the width, or gate length, of a gate electrode of a respective transistor which is formed. The width 330 of each photoresist portion 324 or 326 is preferably less than 0.15 microns, and more preferably less than 0.10 microns.

Figure 3E:
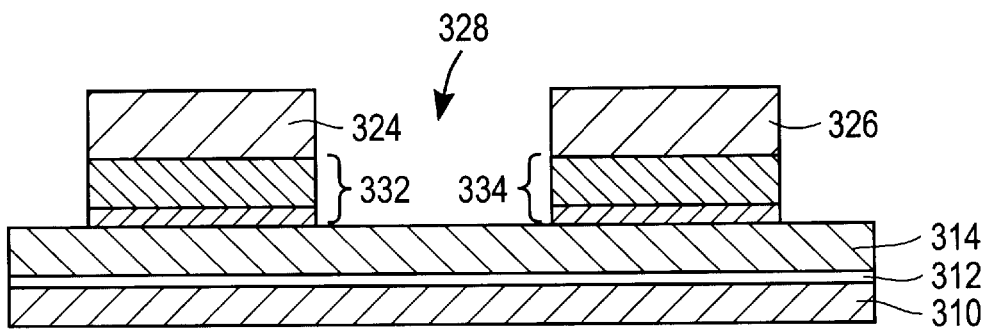
FIG. 3e is a view similar to FIG. 3d after the photoresist layer is utilized to pattern the masking layer.

Next, as illustrated in FIG. 3e, the photoresist portions 324 and 326 are utilized for forming a mask out of the masking layer 316 of FIG. 3d. The masking layer 316 is patterned by etching through the masking layer 316 in areas between the photoresist portions 324 and 326. The masking layer 316 may be patterned using any conventional etching technique such as a wet etch or a dry etch technique which removes the materials of the masking layer 316 selectively over the material of the photoresist portions 324 and 326 and which removes the materials of the masking layer 316 selectively over the material of the first layer 314. The photoresist portions 324 and 326 prevent removal of the masking layer 316 in areas below the photoresist portions 324 and 326 so that portions 332 and 334 of the masking layer 316 (hereinafter referred to as "masking portions 332 and 334") remain below the photoresist portions 324 and 326, and the opening 328 extends all the way down to the first layer 314 and is located between the masking portions 332 and 334. An anisotropic etch technique is preferably used for forming the masking portions 332 and 334.

Figure 3F:
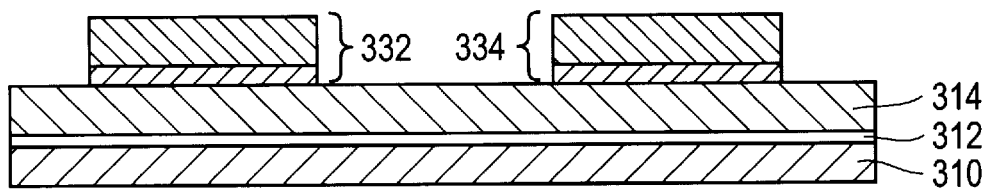
FIG. 3f is a view similar to FIG. 3e after the photoresist layer is removed.

Next, as illustrated in FIG. 3f, the photoresist portions 324 and 326 are removed. Once the photoresist portions 324 and 326 are removed, a structure is provided wherein all exposed surfaces above the gate oxide layer 312 are substantially free of carbon.

Figure 3G:
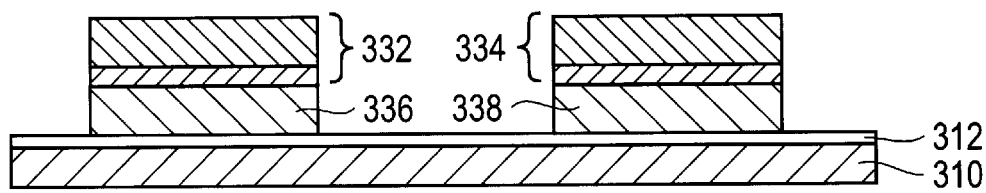
FIG. 3g is a view similar to FIG. 3f after the masking layer is utilized to pattern the first layer.

Next, as illustrated in FIG. 3g, the mask, comprising the masking portions 332 and 334, is utilized for patterning the first layer 314 of FIG. 3f by etching through the first layer 314 in areas between the masking portions 332 and 334. Preferably, a conventional polysilicon dry etch technique is utilized for etching through the first layer 314. A conventional dry etch technique may, for example, use a mixture of hydrogen bromide, chlorine, and oxygen as an etchant. Since there are no exposed surfaces containing any carbon, there is relatively little reaction by the surrounding environment with the gate oxide layer 312. Since there is little reaction with the gate oxide layer 312, there is little or no breakthrough through the oxide layer 312 into the substrate 310, i.e. this substrate remains entirely covered by the gate oxide layer 312 in an area between the masking portions 332 and 334 after the etching step into the first layer 314. Because of the way the first layer 314 is patterned utilizing masking portions 332 and 334 containing little or no carbon, a much thinner gate oxide layer 312 can be manufactured than according to conventional methods. After etching into the first layer 314, portions 336 and 338 of the first layer 314 remain below the masking portions 332 and 334.

Figure 3H:
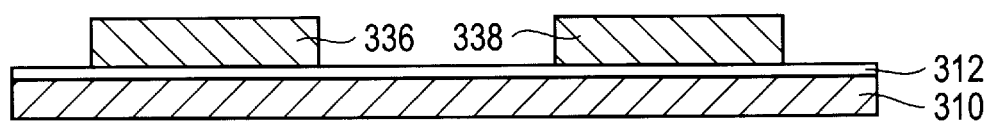
FIG. 3h is a view similar to FIG. 3g after the masking in layer is removed.

Next, as illustrated in FIG. 3h, the masking portions 332 and 334 are removed. The masking portions 332 and 334 may be removed by a conventional etchant which removes the materials of the masking portions 332 and 334 selectively over the material of the portions 336 and 338 remaining of the first layer 314 and which removes the materials of the masking portions 332 and 334 selectively over the gate oxide layer 312. A wet etch chemistry comprising ammonium fluoride, hydrofluoric acid and water may be utilized for removing the masking portions 332 and 334.

Figure 3I:
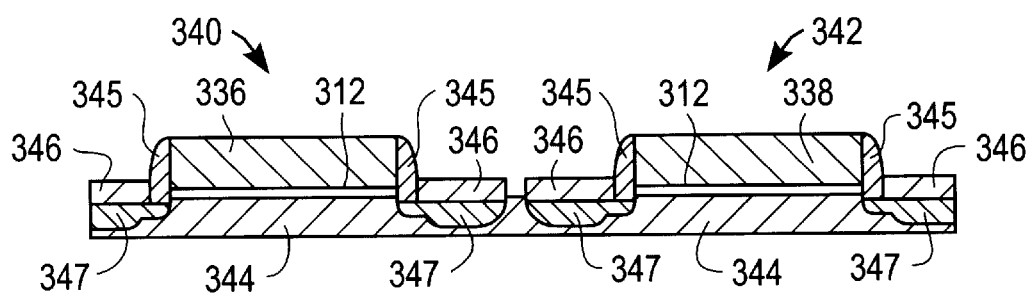
FIG. 3i is a view similar to FIG. 3h after transistors are finally formed in and on the substrate.

Next, as illustrated in FIG. 3i, transistors 340 and 342 may be finally fabricated. Each transistor 340 or 342 includes a well 344 having a dopant concentration, a gate oxide layer 312, and a gate electrode 336 or 338. Spacers 345 are formed on opposing sides of each gate electrode 336 or 338 and silicide regions 346, forming electrical contacts, are formed on opposing sides of each gate electrode 336 or 338 according to conventional methods. If preferred the gate oxide layer 312 between the portions 336 and 338 may be removed prior to the formation of the silicide regions 346. Source and drain regions 347 are formed below the silicide regions 346 and the spacers 345, according to conventional methods.

Because of little breakthrough through the gate oxide layer 312 as discussed with reference to FIG. 3g, the surface of the substrate 310 is not substantially roughened by the dry etch chemistry when the first layer 314 is etched. Silicide regions 346 can then be manufactured in areas where a relatively thin gate oxide layer 312 is formed. Because of the relatively thin gate oxide layer, the threshold voltage of each of the transistors 340 and 342 can be decreased. A decrease in the threshold voltage of each transistor 340 and 342 due to reduction in thickness of the gate oxide layer 312, in turn, allows for an increase of the threshold voltage by increasing the dopant concentration of each well 344.

In addition, a thinner gate oxide will give higher gate capacitance which, in turn, will provide a higher transistor drive current.

Because of an increase in dopant concentration of each well 344, less probability exists for outdiffusion of dopants from the source and drain regions 347 into the well 344 of each transistor 340 or 342. Because of a decreased probability of outdiffusion of dopants into the well 344 of each transistor 340 or 342, the width (see the reference numerals 330 in FIG. 3d), or gate length, of each gate electrode 336 or 338 can be decreased.

In one example the wells 344 have dopant concentrations of at least $1 \times 10^{18}$ atoms per cubic centimeter, the gate oxide layer 312 has a thickness of less than 10 Å, and the gate electrodes 336 and 338 each have a gate length of less than 0.15 microns. In another example the well 344 of each transistor 340 or 342 has a dopant concentration of at least $3 \times 10^{18}$ atoms per cubic centimeter, the gate oxide layer is less than 5 Å thick, and the gate electrode is less than 0.10 microns wide.

Thus, a method of masking the first layer 314 and a method of forming a transistor 340 or 342 have been described, as well as a final transistor 340 or 342.

While certain exemplary embodiments have been described and shown in the accompanying drawings, it is to be understood that such embodiments are merely illustrative and not restrictive of the current invention, and that this invention is not restricted to the specific constructions and arrangements shown and described, since modifications may occur to those ordinarily skilled in the art.

What is claimed:

1. A method of fabricating transistors, comprising:
    forming a gate oxide layer of less than 10 Å on a semiconductor substrate;
    forming a first layer over the gate oxide layer;
    forming a second layer over the first layer,
    forming a third layer over the second layer, the third layer including nitrogen such that, when formed directly on the first layer causes stresses between the first layer and the third layer, but the second layer securing to relieve stresses between the first layer and the third layer, the second layer and the third layer forming a mask over the first layer, the mask being substantially free of carbon and comprising at least two masking portions with an opening between the masking portions;
    etching through the first layer in area between the masking portions, at least until the gate oxide layer is exposed without substantial breakthrough through the gate oxide layer, with the masking portions at least partially preventing etching of portions of the first layer below the masking portions; and
    forming electrical contacts on the substrate in an area where the first layer is etched through;
    etching the mask with an etchant that selectively removes materials of the masking portions including the nitrogen containing third layer, selectively over the first layer; and
    forming a silicide where the gate oxide layer is exposed.

2. The method of claim 1 wherein the semiconductor substrate has a dopant concentration of at least $1 \times 10^{18}$ atoms per cubic centimeter.

3. The method of claim 1 wherein the first layer is a semiconductor layer.

4. The method of claim 3 wherein the semiconductor layer is polysilicon.

5. The method of claim 1 wherein the masking portions are less than 0.15 microns wide.

6. The method of claim 1 wherein the substrate is entirely covered by the gate oxide layer in an area between the masking portions, after the etching step.

7. A method of fabricating transistors, comprising:
    forming a gate oxide layer of less than 10 Å on a semiconductor substrate;
    forming a first layer over the gate oxide layer;
    forming a second layer over the first layer;
    forming a third layer over the second layer, the third layer including nitrogen such that, when formed directly on the first layer causes stresses between the first layer and the third layer, but the second layer securing to relieve stresses between the first layer and the third layer, the second layer and the third layer forming a masking layer over the first layer;

forming a photoresist layer over the masking layer;

patterning the photoresist layer to form at least first and second photoresist portions with an opening between the photoresist portions;

etching through the masking layer in an area between the photoresist portions to leave masking portions of the masking layer below the photoresist portions with the opening between the masking portions;

removing the photoresist portions;

after removal of the photoresist portions, etching through the first layer in an area between the masking portions, at least until the gate oxide layer is exposed without substantial breakthrough through the gate oxide layer, with the masking portions at least partially preventing etching of portions of the first layer below the masking portions;

forming silicide regions where the gate oxide layers are exposed;

forming electrical contacts on the silicide regions; and etching the mask with an etchant that selectively removes materials of the masking portions including the nitrogen containing third layer, selectively over the first layer.

8. The method of claim 7 wherein the substrate is entirely covered by the gate oxide layer in an area between the masking portions, after the etching step.

* * * * *